(12) United States Patent
Chen et al.

(10) Patent No.: US 12,550,514 B2
(45) Date of Patent: Feb. 10, 2026

(54) LIGHT-EMITTING DEVICE WITH CAVITY BETWEEN TOP ELECTRODE PAD AND PROTECTIVE LAYER

(71) Applicant: EPISTAR CORPORATION, Hsinchu (TW)

(72) Inventors: Yong-Yang Chen, Hsinchu (TW); Chao-Hsing Chen, Hsinchu (TW); Chi-Shiang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 498 days.

(21) Appl. No.: 18/128,327

(22) Filed: Mar. 30, 2023

(65) Prior Publication Data
US 2023/0317765 A1 Oct. 5, 2023

(30) Foreign Application Priority Data
Mar. 31, 2022 (TW) .................................. 111112519

(51) Int. Cl.
*H10H 29/14* (2025.01)
(52) U.S. Cl.
CPC ................................ *H10H 29/142* (2025.01)

(58) Field of Classification Search
CPC ...... H10H 29/142; H10H 20/84; H10H 20/857
See application file for complete search history.

(56) References Cited

U.S. PATENT DOCUMENTS

| | | | |
|---|---|---|---|
| 2021/0133528 A1* | 5/2021 | Cortese ............. | G06K 19/0728 |
| 2021/0202571 A1* | 7/2021 | Chen .................... | H10H 29/142 |
| 2022/0367562 A1* | 11/2022 | Chen .................... | H10H 29/142 |
| 2023/0317765 A1* | 10/2023 | Chen .................... | H10H 29/142 257/91 |
| 2024/0194724 A1* | 6/2024 | Chen .................. | H10H 20/8314 |

* cited by examiner

*Primary Examiner* — John P. Dulka
(74) *Attorney, Agent, or Firm* — Patterson + Sheridan, LLP

(57) ABSTRACT

A light-emitting device comprises a plurality of light-emitting elements, comprising a first group light-emitting elements and a second group light-emitting elements; a trench separating the plurality of light-emitting units; a first electrode pad covering the first group light-emitting elements and located on the trench; a second electrode pad covering the second group light-emitting elements and located on the trench; and a cavity located on the trench, formed between the first electrode pad and the protective layer or formed between the second electrode pad and the protective layer.

20 Claims, 10 Drawing Sheets

LIGHT-EMITTING DEVICE WITH CAVITY BETWEEN TOP ELECTRODE PAD AND PROTECTIVE LAYER

REFERENCE TO RELATED APPLICATION

This application claims the right of priority based on TW Application Serial No. 111112519, filed on Mar. 31, 2022, and the content of which is hereby incorporated by reference in its entirety.

TECHNICAL FIELD

The application relates to a light-emitting device, and more particularly, to a light-emitting device including a plurality of light-emitting elements.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed, and good photoelectric property, such as stable emission wavelength. Therefore, the light-emitting diodes are widely used in the household appliances, the equipment indicators, and the optoelectronic products.

SUMMARY OF THE APPLICATION

In accordance with an embodiment of the present application, a light-emitting device includes a plurality of light-emitting elements, including a first group light-emitting elements and a second group light-emitting elements; a trench separating the plurality of light-emitting units; a protective layer covering the plurality of light-emitting elements; a first electrode pad covering the first group light-emitting elements and located on the trench; a second electrode pad covering the second group light-emitting elements and located on the trench; and a cavity located on the trench, formed between the first electrode pad and the protective layer and/or formed between the second electrode pad and the protective layer.

DETAILED DESCRIPTION OF PREFERRED EMBODIMENTS

Figure 1:
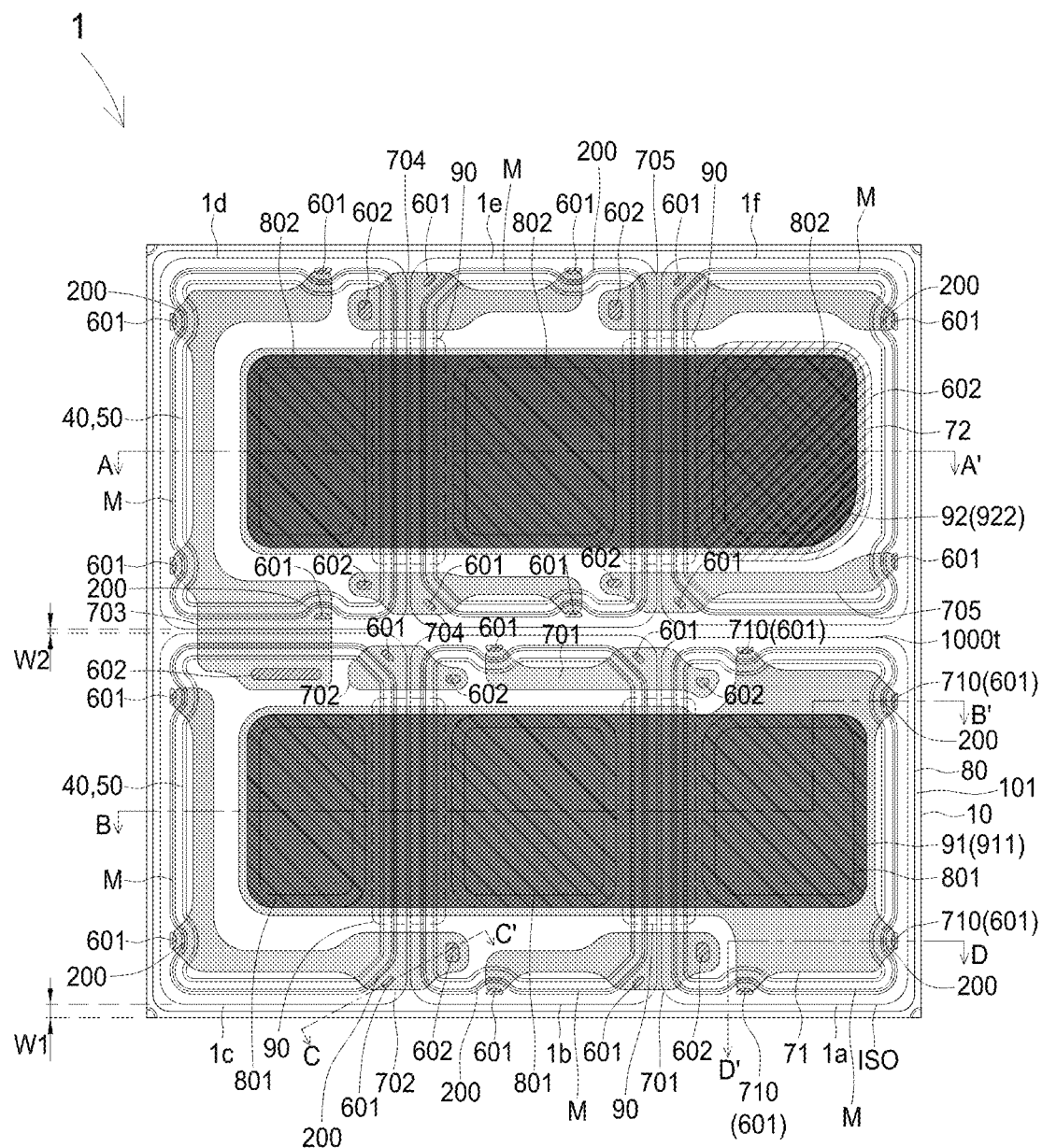
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
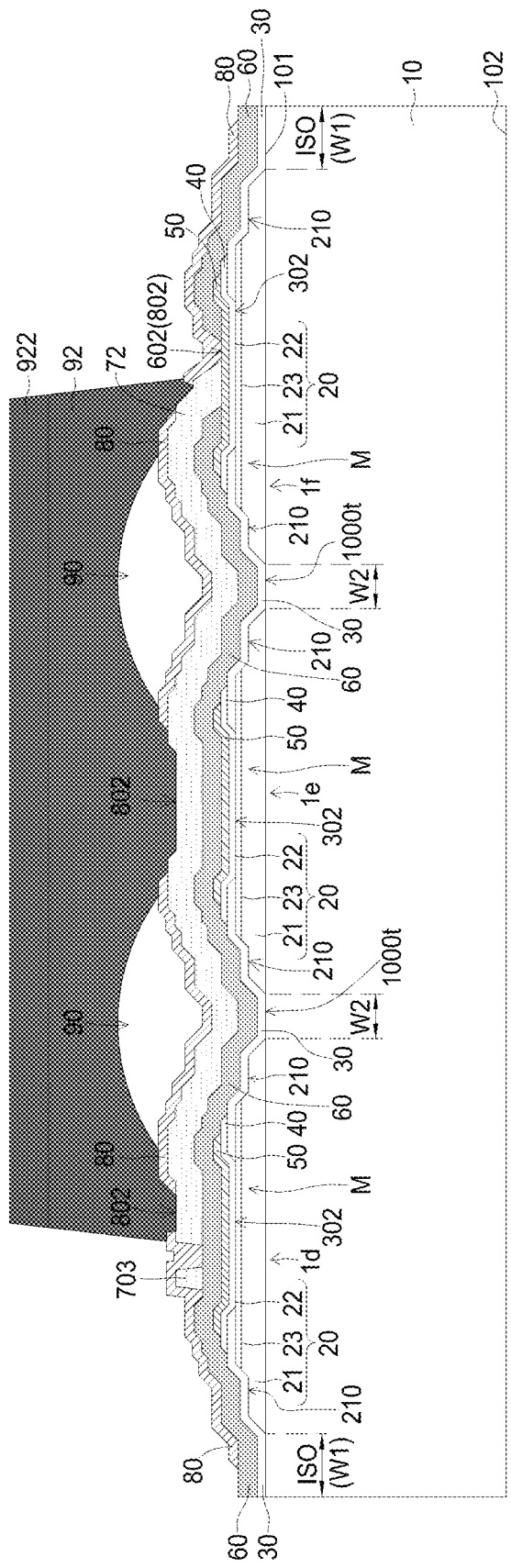
FIG. 2 illustrates a cross-sectional view of the light-emitting device 1 taken along the line A-A' in FIG. 1.
Figure 3:
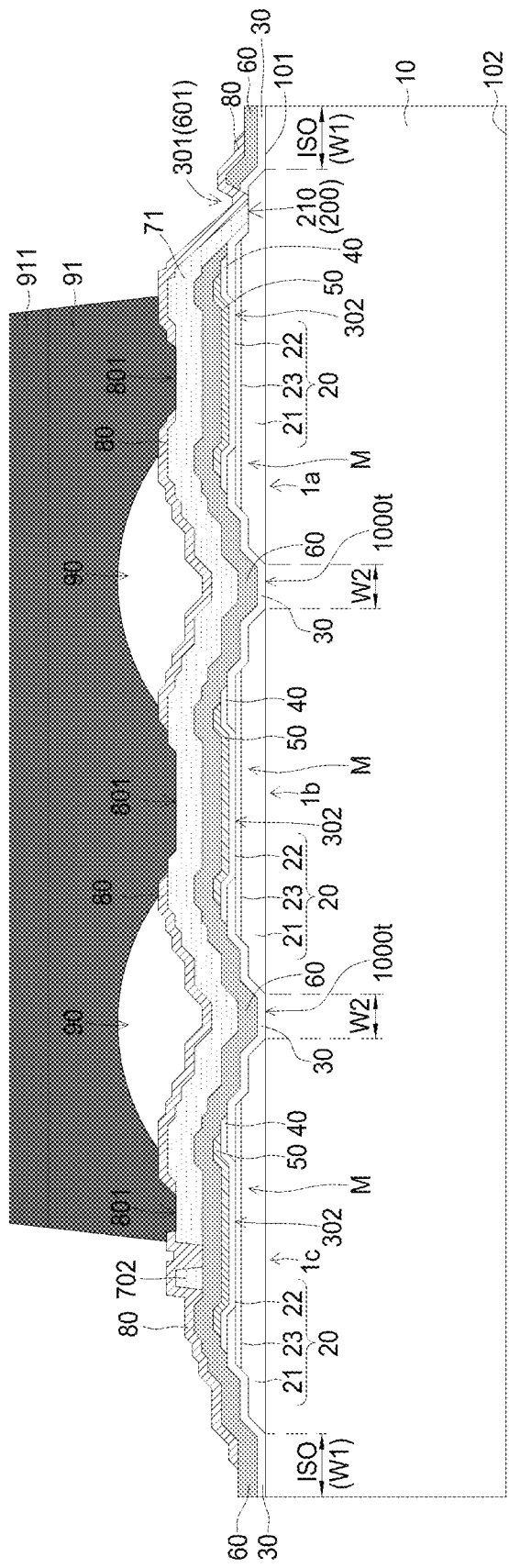
FIG. 3 illustrates a cross-sectional view of the light-emitting device 1 taken along the line B-B' in FIG. 1.
Figure 4:
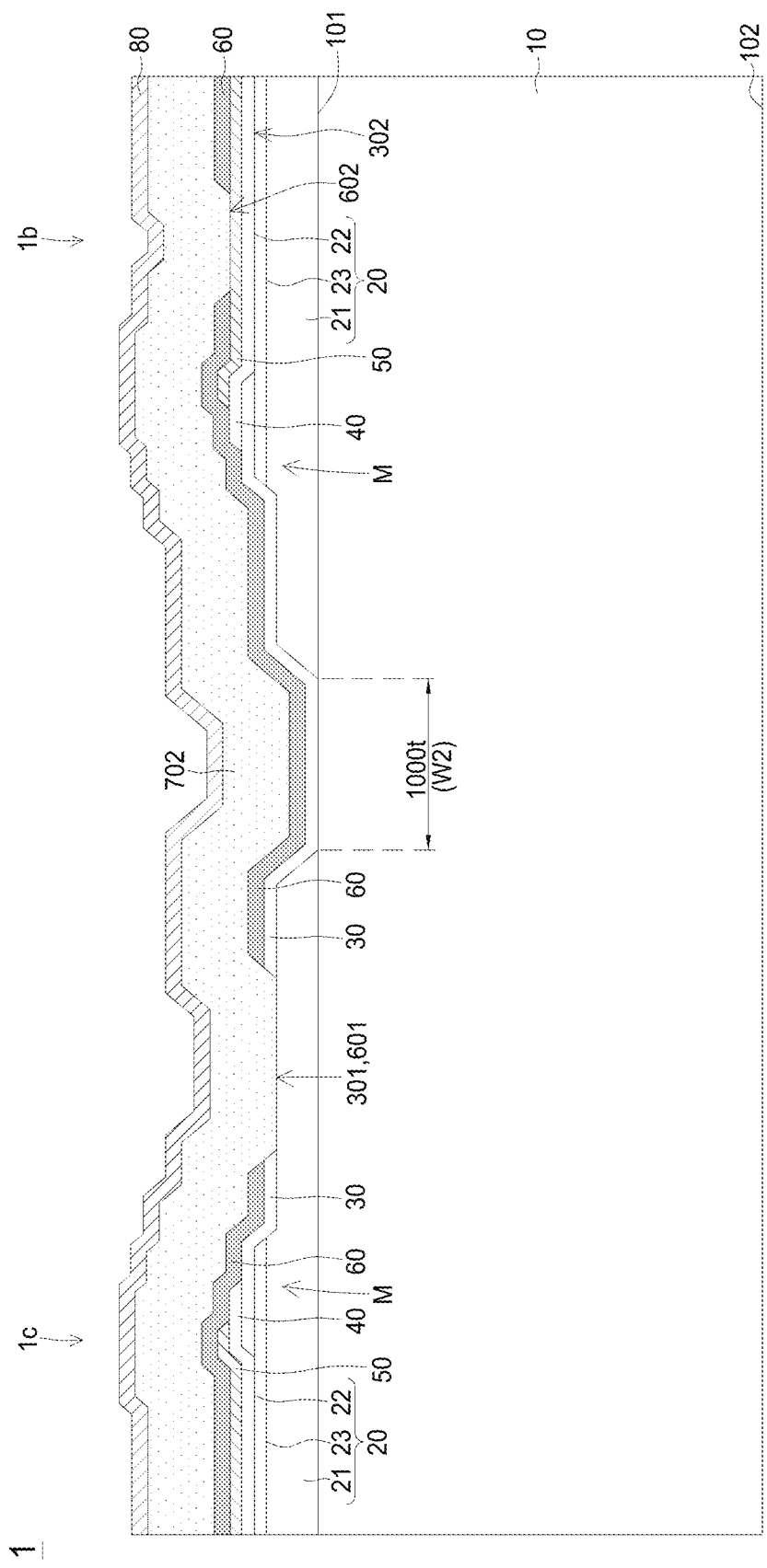
FIG. 4 illustrates a cross-sectional view of the light-emitting device 1 taken along the line C-C' in FIG. 1.
Figure 5:
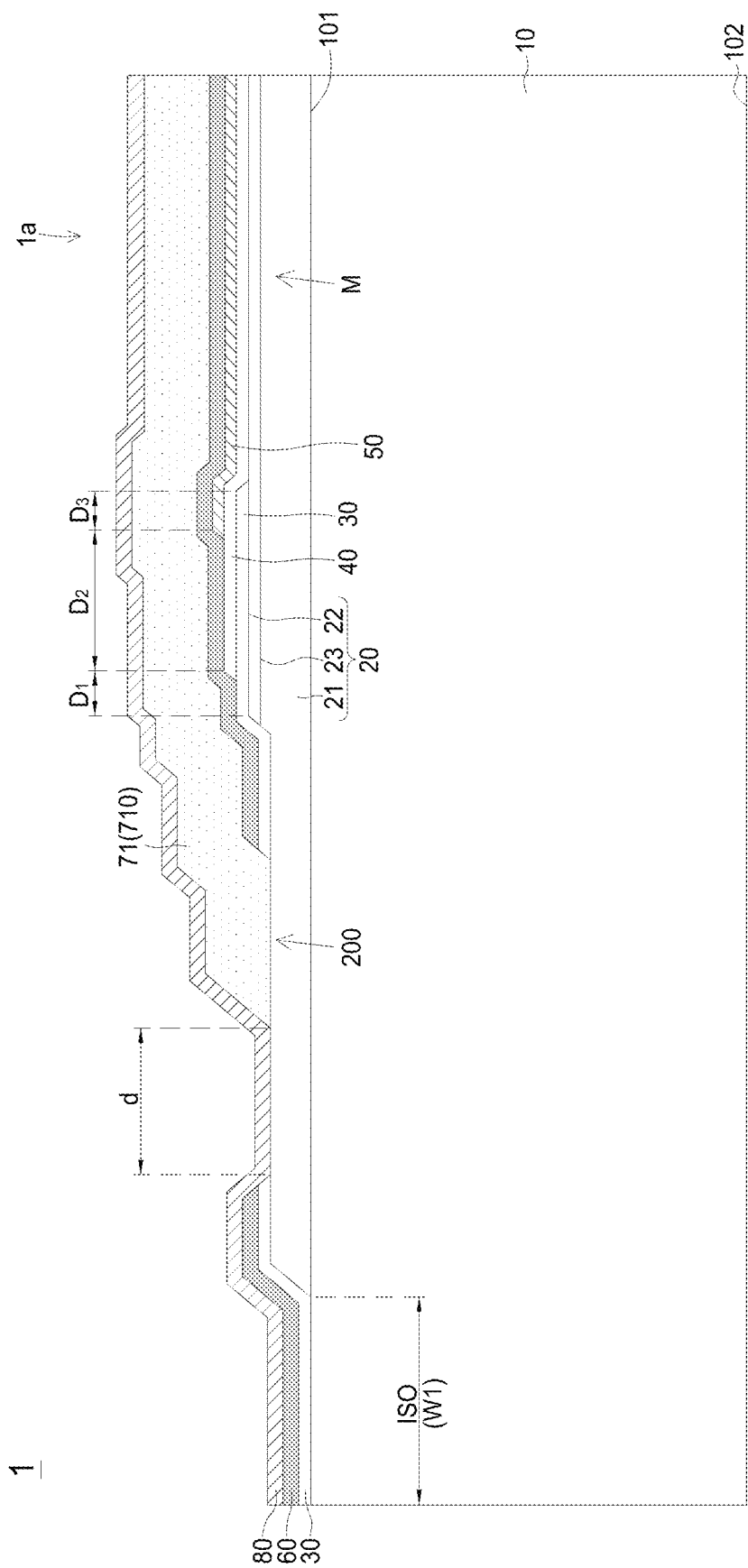
FIG. 5 illustrates a cross-sectional view of the light-emitting device 1 taken along the line D-D' in FIG. 1.

FIG. 1 illustrates a top view of a light-emitting device 1 in accordance with an embodiment of the present application. FIG. 2 illustrates a cross-sectional view of the light-emitting device 1 taken along the line A-A' in FIG. 1. FIG. 3 illustrates a cross-sectional view of the light-emitting device 1 taken along the line B-B' in FIG. 1. FIG. 4 illustrates a cross-sectional view of the light-emitting device 1 taken along the line C-C' in FIG. 1. FIG. 5 illustrates a cross-sectional view of the light-emitting device 1 taken along the line D-D' in FIG. 1.

The light-emitting device 1 is a light-emitting diode chip with a larger top view area, wherein a side of the chip includes a length between 800 µm and 2000 µm. For example, the chip has dimensions of 1200 µm×1200 µm or 900 µm×900 µm. However, the horizontal and the longitudinal lengths of the light-emitting device 1 of the embodiment are not limited to the above. The light-emitting device 1 includes a thickness between 60 µm and 150 µm or includes a thickness between 80 µm and 120 µm. In another embodiment, the light-emitting device 1 includes a thickness between 150 µm and 800 µm or between 500 µm and 800 µm.

As shown in FIGS. 1~5, the light-emitting device 1 includes a substrate 10, a plurality of light-emitting elements 1a~1f, a lower insulating layer 30, a conductive contact layer 40, a reflective structure 50, an upper insulating layer 60, a first extension electrode 71, a second extension electrode 72, a plurality of connecting parts 701~705, a protective layer 80, a first electrode pad 91, and a second electrode pad 92.

The substrate 10 includes a first surface 101 and a second surface 102 opposite to the first surface 101. The plurality of light-emitting elements 1a~1f is formed on the first surface 101 of the substrate 10 and separated from each other by a trench 1000t. In an embodiment, the plurality of light-emitting elements 1a~1f includes a first light-emitting element 1a, a second light-emitting element 1b, a third light-emitting element 1c, a fourth light-emitting element 1d, a fifth light-emitting element 1e, and a sixth light-emitting element 1f. Although the embodiment of the present application is exemplarily illustrated with six light-emitting elements 1a~1f, the amount of the light-emitting elements of the light-emitting device 1 in the present application is not limited to six. Although the trench 1000t is exemplarily illustrated with a continuous channel with multiple branches to separate the plurality of light-emitting elements 1a~1f from each other, the light-emitting device 1 can include a plurality of trenches 1000t to separate the plurality of light-emitting elements 1a~1f from each other.

The plurality of connecting parts 701~705 includes a first connecting part 701 between the first light-emitting element 1a and the second light-emitting element 1b, a second connecting part 702 between the second light-emitting element 1b and the third light-emitting element 1c, a third connecting part 703 between the third light-emitting element 1c and the fourth light-emitting element 1d, a fourth connecting part 704 between the fourth light-emitting element 1d and the fifth light-emitting element 1e, a fifth connecting part 705 between the fifth light-emitting element 1e and the sixth light-emitting element 1f.

As shown in FIG. 1, the first surface 101 of the substrate 10 is uncovered around the peripheries of the light-emitting elements 1a~1f. The uncovered first surface 101 around the peripheries of the light-emitting elements 1a~1f is referred to as an isolation region ISO. The trench 1000t separates the light-emitting elements 1a~1f from each other. Accordingly, the first surface 101 of the substrate 10 is uncovered by the light-emitting elements 1a~1f on the trench 1000t. The isolation region ISO includes a first width W1 larger than a second width W2 of the trench 1000t. The first width W1 is between 5 μm and 50 μm, 5 μm and 30 μm, or 5 μm and 15 μm. The isolation region ISO and the trench 1000t can be formed by lithography and etching processes. The light-emitting elements 1a~1f are separated from each other by the trench 1000t. As shown in FIGS. 2~5, the plurality of light-emitting elements 1a~1f includes a first group containing light-emitting elements 1a~1c and a second group containing light-emitting elements 1d~1f. The light-emitting elements 1a~1f each includes a semiconductor stack 20. The semiconductor stack 20 includes a first semiconductor layer 21, a second semiconductor layer 22, and an active layer 23, wherein the active layer 23 is located between the first semiconductor layer 21 and the second semiconductor layer 22. The first semiconductor layer 21 is a layer epitaxially grown on the substrate 10 and can be a gallium nitride based semiconductor layer doped with impurities such as silicon (Si). The top view area or the cross-sectional view area of the active layer 23 and the second semiconductor layer 22 are respectively smaller than the top view area or the cross-sectional view area of the first semiconductor layer 21. The active layer 23 and the second semiconductor layer 22 can be partially removed by dry etching or wet etching to form the mesa M on the first semiconductor layer 21.

On the peripheries of the light-emitting elements 1a~1f, the edges of the first semiconductor layer 21 and the edges of the mesa M (for example, the edges of the active layer 23 and the edges of the second semiconductor layer 22) can be spaced apart to expose the upper surface of the first semiconductor layer 21 or not spaced apart from each other without exposing the upper surface of the first semiconductor layer 21. That is, the upper surface of the first semiconductor layer 21 can be continuously or discontinuously exposed beyond the mesa M and surround the mesa M. In another embodiment (not shown), the edge of the first semiconductor layer 21 and the edges of the active layer 23 and the second semiconductor layer 22 can be located on the same inclined plane. Therefore, on the side where the light-emitting elements 1a~1f face each other or not, the upper surface of the first semiconductor layer 21 are not exposed so the removal areas of the active layer 23 and the second semiconductor layer 22 are reduced, thereby the luminous area of the light-emitting elements 1a~1f is increased.

The substrate 10 can be a growth substrate for epitaxially growing the semiconductor stack 20. The substrate 10 includes a gallium arsenide (GaAs) wafer for the epitaxial growth of aluminum gallium indium phosphide (AlGaInP), or a sapphire ($Al_2O_3$) wafer, a gallium nitride (GaN) wafer, a silicon carbide (SiC) wafer, or an aluminum nitride (AlN) wafer for the epitaxial growth of gallium nitride (GaN), indium gallium nitride (InGaN), or aluminum gallium nitride (AlGaN).

The first surface 101 of the substrate 10 in contact with the semiconductor stack 20 can be a roughened surface. The roughened surface can be a surface with an irregular morphology or a surface with a regular morphology. Relative to the first surface 101 of the substrate 10, the substrate 10 includes a plurality of protrusions (not shown) protruding from the first surface 101 or a plurality of recesses (not shown) recessed from the first surface 101 (not shown). In the cross-sectional view, the protrusion or the recess includes the shape of a hemisphere or a polygonal pyramid.

In an embodiment of the present application, the metal organic chemical vapor deposition (MOCVD), molecular beam epitaxy (MBE), hydride vapor phase epitaxy (HVPE), physical vapor deposition (PVD), or ion plating method is provided to form the semiconductor stack 20 with photo-electrical characteristics, such as a light-emitting stack, on the substrate 10, wherein the physical vapor deposition method includes sputtering or evaporation.

The wavelength of the light emitted from the light-emitting device 1 can be adjusted by changing the physical and/or the chemical composition of one or more layers of the semiconductor stack 20. The material of the semiconductor stack 20 includes group III-V semiconductor materials, such as $Al_xIn_yGa_{(1-x-y)}N$ or $Al_xIn_yGa_{(1-x-y)}P$, wherein 0≤x, y≤1; (x+y)≤1. The active layer 23 includes a single heterostructure (SH) or a multi-quantum well structure (MQW) including a well layer having a compositional formula of $In_{x1}Al_{y1}Ga_{1-x1-y1}N$ (0≤x1≤1, 0≤y1≤1, 0≤x1+y1≤1) and a barrier layer having a compositional formula of $In_{x2}Al_{y2}Ga_{1-x2-y2}N$ (0≤x2≤1, 0≤y2≤1, 0≤x2+y2≤1). The well layer includes a material having an energy band gap less than that of the barrier layer. The composition and the thickness of the well layer of the active layer 23 determine the wavelength of the light. By adjusting the composition of the well layer, the active layer that can generate ultraviolet, blue, or green light is provided. When the material of the semiconductor stack 20 includes AlInGaP series material, the red light having a wavelength between 610 nm and 650 nm can be emitted. When the material of the semiconductor stack 20 includes InGaN series material, the blue light having a wavelength between 400 nm and 490 nm, the cyan light having a wavelength between 490 nm and 500 nm, or the green light having a wavelength between 500 nm and 570 nm can be emitted. When the material of the semiconductor stack 20 includes AlGaN series or AlInGaN series material, the ultraviolet light having a wavelength between 250 nm and 400 nm can be emitted.

The first semiconductor layer 21 and the second semiconductor layer 22 can be cladding layers or confinement layers having different conductivity types, electrical properties, polarities, or doping elements for providing electrons or holes. For example, the first semiconductor layer 21 is an n-type semiconductor layer and the second semiconductor layer 22 is a p-type semiconductor layer. The active layer 23 is formed between the first semiconductor layer 21 and the second semiconductor layer 22. The electrons and the holes are combined in the active layer 23 under a current so the electrical energy is converted into the light energy to emit the light. The active layer 23 can be a single heterostructure (SH), a double heterostructure (DH), a double-side double heterostructure (DDH), or a multi-quantum well structure (MQW). The material of the active layer 23 can be i-type, p-type, or n-type semiconductor. The first semiconductor layer 21, the second semiconductor layer 22, or the active layer 23 can be a single layer or a structure including a plurality of sublayers.

In an embodiment of the present application, the semiconductor stack 20 further includes a buffer layer (not shown) formed between the first semiconductor layer 21 and the substrate 10, which can release the stress caused by the lattice mismatch between the materials of the substrate 10 and the semiconductor stack 20, so the lattice dislocation and the lattice defect are reduced, and the epitaxial quality of the semiconductor stack 20 is improved. The buffer layer includes a single layer or a structure including a plurality of sublayers. In an embodiment, an aluminum nitride (AlN) layer formed by PVD method can be the buffer layer located between the semiconductor stack 20 and the substrate 10 to improve the epitaxial quality of the semiconductor stack 20. In an embodiment, when the method for forming the aluminum nitride (AlN) is PVD, the target can be made of aluminum nitride. In another embodiment, a target made of aluminum reacts with a nitrogen source to form the aluminum nitride.

The light-emitting elements 1a~1f each includes a through hole (not shown) and/or a surrounding portion 210 penetrating through the second semiconductor layer 22 and the active layer 23 to expose the first semiconductor layer 21. The through hole (not shown) is surrounded by the second semiconductor layer 22 and the active layer 23. For example, one or a plurality of through holes can be formed inside the mesa M of each or any one of the light-emitting elements 1a~1f, and the through hole includes the circular shape, the elliptical shape, the strip shape, or any other shape. The surrounding portion 210 continuously or discontinuously surrounds the second semiconductor layer 22 and the active layer 23 so the first semiconductor layer 21 can be continuously or discontinuously exposed on the peripheries of each of the light-emitting elements 1a~1f.

The lower insulating layer 30 covers the upper surfaces of the light-emitting elements 1a~1f and covers the side surfaces of the light-emitting elements 1a~1f along the peripheries of the light-emitting elements 1a~1f, then partially covers the first semiconductor layer 21 uncovered in the through hole (not shown) and/or the surrounding portion 210, and entirely or partially covers the first surface 101 of the substrate 10 uncovered on the trench 1000t and the peripheries of the light-emitting elements 1a~1f, such as the isolation region ISO.

The lower insulating layer 30 includes a first lower insulating layer opening 301 exposing the first semiconductor layer 21 and a second lower insulating layer opening 302 exposing the second semiconductor layer 22. The first lower insulating layer opening 301 uncovers the first semiconductor layer 21 on the through hole (not shown) and/or that on the surrounding portion 210. In an embodiment, the first lower insulating layer opening 301 uncovers the first surface 101 of the substrate 10 along the peripheries of the substrate 10, such as the first surface 101 on the isolation region ISO.

The second lower insulating layer opening 302 is located on the second semiconductor layer 22 and uncovers the second semiconductor layer 22. The position and the shape of the second lower insulating layer opening 302 can be variously modified in accordance with the arrangement of the light-emitting elements 1a~1f and the electrical connection therebetween. Although FIGS. 2~3 illustrate the example where one second lower insulating layer opening 302 is arranged on each of the light-emitting elements 1a~1f, but multiple second lower insulating layer openings 302 can be arranged on each or any one of the light-emitting elements 1a~1f in another example.

The conductive contact layer 40 fills and/or covers the second lower insulating layer opening 302 to contact the second semiconductor layer 22. The conductive contact layer 40 can be an ohmic contact layer to reduce the contact resistance between the reflective structure 50 and the second semiconductor layer 22 to improve the current spreading efficiency. In an embodiment, the conductive contact layer 40 is formed in the second lower insulating layer opening 302 and extends between the lower insulating layer 30 and the second semiconductor layer 22. In an embodiment, the conductive contact layer 40 is formed in the second lower insulating layer opening 302, and includes a lower portion extending between the lower insulating layer 30 and the second semiconductor layer 22 (not shown) and an upper portion extending above the lower insulating layer 30. In the cross-sectional view of the light-emitting device 1, the upper portion and the lower portion (not shown) of the conductive contact layer 40, and the lower insulating layer 30 include an overlapping area. The material of the conductive contact layer 40 includes a material that is transparent to the light emitted from the active layer 23. The conductive contact layer 40 includes transparent conductive oxide such as Indium Tin Oxide (ITO), Zinc Oxide (ZnO), Zinc Indium Tin Oxide (ZITO), Zinc Indium Oxide (ZIO), Zinc Tin Oxide (ZTO), Gallium Indium Tin Oxide (GITO), Gallium Indium Oxide (GIO), Gallium Zinc Oxide (GZO), Aluminum Doped Zinc Oxide (AZO), or Fluorine Doped Tin Oxide (FTO). In another embodiment, the conductive contact layer 40 includes at least one of the light-transmitting metals such as aluminum (Al), nickel (Ni), or gold (Au) with a thickness less than 500 angstroms. The transparent conductive oxide can further include dopants. The conductive contact layer 40 substantially encloses the second semiconductor layer 22, or can be separated from the edge of the mesa M by a first distance D1 as shown in FIG. 5. In an embodiment, the first distance D1 is larger than 1 μm, larger than 2 μm, or larger than 3 μm, and the first distance D1 is less than 6 μm, less than 5 μm, or less than 4 μm.

The reflective structure 50 is disposed on the conductive contact layer 40 and/or the second semiconductor layer 22 of each of the light-emitting elements 1a~1f. The reflective structure 50 can be electrically connected to the second semiconductor layer 22 of each of the light-emitting elements 1a~1f. The reflective structure 50 can substantially cover the entire area of the conductive contact layer 40 and the second semiconductor layer 22, or can be separated from the edge of the mesa M by a distance or separated from the edge of the conductive contact layer 40 by a second distance D2 as shown in FIG. 5. In an embodiment, the second distance D2 is between 2.5 μm~3 μm, between 1.5 μm~2 μm, or between 0.5 μm~1 μm. For example, the reflective structure 50 covers more than 80% or 90% area of the second semiconductor layer 22 when the reflective structure 50 is separated from the edge of the mesa M by a distance. In an embodiment, the reflective structure 50 and the conductive contact layer 40 can entirely overlap each other, so that the reflective structure 50 and the conductive contact layer 40 include the same top view area. In another embodiment, the reflective structure 50 and the conductive contact layer 40 partially overlap, so that the reflective structure 50 and the conductive contact layer 40 include different top view areas. In another embodiment, the reflective structure 50, the conductive contact layer 40, and the lower insulating layer 30 include an overlapping area adjacent to the edge of the mesa M, which includes a third distance D3. In an embodiment, the third distance D3 is between 6 µm~14 µm, between 8 µm~12 µm, or between 9 µm~11 µm. In another embodiment, the reflective structure 50 can extend to cover the area beyond the mesa M (not shown), cover the side surface of the second semiconductor layer 22, and be isolated from the second semiconductor layer 22 by the lower insulating layer 30. In order to prevent the moisture from penetrating into the light-emitting elements 1a~1f from the sidewalls thereof or the edge of the substrate 10 to cause the damage, the edge of the reflective structure 50 can be disposed inside the light-emitting elements 1a~1f relative to the edge of the mesa M. In an embodiment, the reflective structure 50 includes a reflective metal, such as aluminum (Al), silver (Ag), rhodium (Rh), platinum (Pt), or an alloy of the above materials to reflect the light from the active layer 23 and travelling towards the reflective structure 50 back towards the second surface 102 of the substrate 10. In another embodiment, the reflective structure 50 includes a Distributed Bragg Reflector (DBR). The Distributed Bragg Reflector includes a plurality of dielectric layers with different refractive indices alternatively stacked on each other. The dielectric layers include $TiO_2$, $SiO_2$, $HfO_2$, $ZrO_2$, $Nb_2O_5$, or $MgF_2$. For example, the Distributed Bragg Reflector is formed by alternately stacking 4 to 20 pairs of $TiO_2$ layers/$SiO_2$ layers. The layers of the Distributed Bragg Reflector each includes an optical thickness of ¼ of a particular wavelength.

As shown in FIG. 5, the lower insulating layer 30, the conductive contact layer 40, and the reflective structure 50 can be configured as an omnidirectional reflector. The omnidirectional reflector can increase the reflectivity of the light emitted from the active layer 23 to improve the light extraction efficiency. The reflective structure 50 can be disposed directly on the conductive contact layer 40 to be conformal with the profile of the conductive contact layer 40. The conductive contact layer 40 can improve and enhance the adhesion between the reflective structure 50 and the lower insulating layer 30. The upper insulating layer 60 covers the upper and the side surfaces of the reflective structure 50 to protect the reflective structure 50. The upper insulating layer 60 can also cover the upper and the side surfaces of the conductive contact layer 40. The conductive contact layer 40 and the reflective structure 50 are encapsulated between the upper insulating layer 60 and the lower insulating layer 30. Metal migration of the reflective structure 50 can be suppressed through the upper insulating layer 60.

The upper insulating layer 60 covers the light-emitting elements 1a~1f, the conductive contact layer 40, and the reflective structure 50. The upper insulating layer 60 not only covers the upper surfaces of the light-emitting elements 1a~1f, but also covers the side surfaces of the light-emitting elements 1a~1f along the peripheries thereof, entirely or partially covers the trench 1000t between the light-emitting elements 1a~1f, and entirely or partially covers the isolation region ISO. The upper insulating layer 60 partially covers the first semiconductor layer 21 uncovered in the through hole (not shown) and/or the surrounding portion 210.

As shown in FIG. 2 and FIG. 3, the upper insulating layer 60 includes a first upper insulating layer opening 601 to uncover the first semiconductor layer 21 and a second upper insulating layer opening 602 to uncover the reflective structure 50 or the conductive contact layer 40. The first upper insulating layer opening 601 uncovers the first semiconductor layer 21 on the through hole (not shown) and/or the surrounding portion 210, and/or uncovers the first surface 101 of the substrate 10 along the peripheries of the substrate 10.

In the embodiment, the second upper insulating layer opening 602 is located on the reflective structure 50 to uncover the reflective structure 50. The position and the shape of the second upper insulating layer opening 602 can be variously modified in accordance with the arrangement of the light-emitting elements 1a~1f and the electrical connection therebetween. FIG. 1 illustrates an example that the multiple second upper insulating layer openings 602 are arranged on each of the light-emitting elements 1a~1b and the light-emitting elements 1d~1e, and one second upper insulating layer opening 602 is arranged on each of the light-emitting elements 1c and 1f. Here, the light-emitting elements 1a~1f are arranged into two columns in the form of an array. The sixth light-emitting element 1f is the last light-emitting element and arranged with one second upper insulating layer opening 602. The third light-emitting element 1c connects the light-emitting elements of different columns and is arranged with one second upper insulating layer opening 602.

In the embodiment of the present application, as shown in FIG. 1, the first extension electrode 71 and the second extension electrode 72 of the light-emitting device 1 are formed on the same side of the substrate 10. The light-emitting device 1 includes a flip chip structure or a horizontal chip structure.

Referring to FIG. 1, the first extension electrode 71, the second extension electrode 72, and the plurality of connecting parts 701~705 are disposed on the upper insulating layer 60 and on the region where the surface morphology changes significantly. The second extension electrode 72 covers the second group containing light-emitting elements 1d~1f, directly contacts and/or is electrically connected to the second semiconductor layer 22 of the sixth light-emitting element 1f through the second upper insulating layer opening 602. The second extension electrode 72 is electrically insulated from the fourth light-emitting element 1d and the fifth light-emitting element 1e by the upper insulating layer 60. The light from the active layer 23 of the second group containing light-emitting elements 1d~1f is reflected by the second extension electrode 72 to improve the light-emitting efficiency of the light-emitting device 1. The first extension electrode 71 covers the first group containing light-emitting elements 1a~1c, and directly contacts and/or is electrically connected to the first semiconductor layer 21 of the first light-emitting element 1a through the first upper insulating layer opening 601. The first extension electrode 71 is electrically insulated from the second light-emitting element 1b and the third light-emitting element 1c by the upper insulating layer 60. The light from the active layer 23 of the first group containing light-emitting elements 1a~1c is reflected by the first extension electrode 71, thereby improving the light-emitting efficiency of the light-emitting device 1. In addition, the plurality of connecting parts 701~705 is sequentially arranged to cover the upper parts of the light-emitting elements 1a~1f and electrically connect the light-emitting elements 1a~1f in series. Accordingly, as shown in FIG. 1, the six light-emitting elements 1a~1f are connected in series through the plurality of connecting parts 701~705 to form a series array. Here, the first light-emitting element 1a, which is the first light-emitting element of the light-emitting device 1, is located at the first end of the series array, and the sixth light-emitting element 1f, which is the last light-emitting element of the light-emitting device 1, is located at the second end of the series array.

The first extension electrode 71 partially overlaps with the first electrode pad 91 formed in the subsequent process and the second extension electrode 72 partially overlaps with the second electrode pad 92 formed in the subsequent process. The first extension electrode 71 and the second extension electrode 72 can reduce the height difference on the surfaces of the first electrode pad 91 and the second electrode pad 92 to improve the flatness of the surfaces of the first electrode pad 91 and the second electrode pad 92.

As shown in FIG. 1, the mesa M of each of the light-emitting elements 1a~1f includes one or more concave portions 200 extending toward the interior of each of the light-emitting elements 1a~1f and the first semiconductor layer 21 is uncovered in the concave portions 200. The position and shape of the concave portion 200 can be variously modified in accordance with the arrangement of the light-emitting elements 1a~1f and the electrical connection therebetween. The plurality of concave portions 200 can be disposed on the same side or different sides of each of the light-emitting element 1a~1f and/or the corners of each of the light-emitting element 1a~1f. The amount of the concave portions 200 on different sides of each of the light-emitting element 1a~1f can be the same or different. In another embodiment, the amount of the concave portions 200 arranged on the longer side is larger than the amount of the concave portions 200 arranged on the shorter side. The amount of the concave portions 200 of each of the light-emitting elements 1a~1f can be the same or different from each other. The lower insulating layer 30 and/or the upper insulating layer 60 cover the concave portions 200 of the light-emitting elements 1a~1f, and the first lower insulating layer opening 301 and/or the first upper insulating layer opening 601 are formed on the concave portion 200 of the light-emitting elements 1a~1f. The first extension electrode 71 formed in the subsequent process directly contacts and/or is electrically connected to the first semiconductor layers 21 of the first light-emitting element 1a through the first upper insulating layer opening 601 of the upper insulating layer 60 and/or the first lower insulating layer opening 301 of the lower insulating layer 30. The amount of the first upper insulating layer openings 601 on the concave portions 200 are the same as that of the concave portions 200. As the amount of the concave portions 200 increases, the area of the first extension electrodes 71 formed on the concave portions 200 in the subsequent process also increases, thereby improving the current spreading of the first light-emitting elements 1a.

In an embodiment of the present application, as shown in FIG. 1, the mesa M of the first light-emitting element 1a includes a plurality of concave portions 200, and the amount of concave portions 200 on the longer side of the first light-emitting element 1a is larger than the amount of concave portions 200 on the shorter side of the first light-emitting element 1a. The first extension electrode 71 includes a plurality of first extension electrode convex portions 710 respectively corresponding to the plurality of concave portions 200 of the first light-emitting element 1a, and the first extension electrode convex portion 710 entirely or partially cover the first upper insulating layer opening 601 and/or the first lower insulating layer opening 301 disposed on the concave portion 200. In the embodiment, there is a distance d between the edge of the first extension electrode convex portion 710 and the edge of the first upper insulating layer 60, as shown in FIG. 5. In an embodiment, the distance d is between 0.5 µm~6 µm, between 1 µm~5 µm, or between 2 µm~4 µm.

In another embodiment of the present application, as shown in FIG. 1, the first light-emitting elements 1a and the second light-emitting element 1b each includes two longer sides and two shorter sides, and the first light-emitting elements 1a and the second light-emitting element 1b face each other by the longer sides thereof. In another embodiment, the first light-emitting elements 1a and the second light-emitting element 1b face each other by the shorter sides thereof (not shown). The plurality of connecting parts 701 covers the longer sides (or the shorter sides in the another embodiment) of the first light-emitting elements 1a and the second light-emitting element 1b, electrically connects the second semiconductor layer 22 of the first light-emitting element 1a through the second upper insulating layer opening 602, electrically connects the first semiconductor layer 21 of the second light-emitting element 1b through the first upper insulating layer opening 601, and further electrically connects the first light-emitting elements 1a and the second light-emitting element 1b in series. The connecting part 701 covers all or a portion of the first upper insulating layer opening 601 and/or that of the first lower insulating layer opening 301 (not shown) disposed on the concave portion 200 of the second light-emitting element 1b, but the connecting part 701 covers all of the second upper insulating layer opening 602 on the first light-emitting element 1a. The same connecting part 701 can cover the first upper insulating layer opening 601 on the longer side and the first upper insulating layer opening 601 on the shorter side of the second light-emitting element 1b, so that the projected area of the connecting part 701 projected on the second light-emitting element 1b is larger than that projected on the first light-emitting element 1a. As shown in FIG. 1, in the top view of the light-emitting device 1, the first extension electrode 71 includes a portion located between two of the plurality of connecting parts 701. In the cross-sectional view of the light-emitting device 1, the connecting part 701 and the first extension electrode 71 conformally cover the side surfaces of the first light-emitting elements 1a and the second light-emitting element 1b and the first surface 101 of the substrate 10.

In another embodiment of the present application, as shown in FIG. 1, the second light-emitting elements 1b and the third light-emitting element 1c each includes two longer sides and two shorter sides, and the second light-emitting elements 1b and the third light-emitting element 1c face each other by the longer sides thereof. In another embodiment, the second light-emitting element 1b and the third light-emitting element 1c face each other by the shorter sides thereof (not shown). The plurality of connecting parts 702 covers the longer sides (or the shorter sides in the another embodiment) of the second light-emitting elements 1b and the third light-emitting element 1c, electrically connects the second semiconductor layer 22 of the second light-emitting element 1b through the second upper insulating layer opening 602, electrically connects the first semiconductor layer 21 of the third light-emitting element 1c through the first upper insulating layer opening 601, and further electrically connects the second light-emitting elements 1b and the third light-emitting element 1c in series. The connecting part 702 covers all or a portion of the first upper insulating layer opening 601 and/or that of the first lower insulating layer opening 301 (not shown) disposed on the concave portion 200 of the third light-emitting element 1c, but the connecting part 702 covers all of the second upper insulating layer opening 602 and/or that of the second lower insulating layer opening 302 (not shown) on the second light-emitting element 1b. The same connecting part 702 covers the first upper insulating layer opening 601 and/or the first lower insulating layer opening 301 (not shown) on the longer side of the third light-emitting element 1c, and one or more first upper insulating layer openings 601 and/or the first lower insulating layer openings 301 (not shown) on the other longer side, so that the projected area of the connecting part 702 projected on the third light-emitting element 1c is larger than that of the connecting part 702 projected on the second light-emitting element 1b. As shown in FIG. 1, in the top view of the light-emitting device 1, the first extension electrode 71 includes a portion located between the two connecting parts 702. As shown in FIG. 3, in the cross-sectional view of the light-emitting device 1, the connecting part 702 and the first extension electrode 71 conformally cover the side surfaces of the second light-emitting element 1b and the third light-emitting element 1c and the first surface 101 of the substrate 10.

In another embodiment of the present application, as shown in FIG. 1, the third light-emitting element 1c and the fourth light-emitting element 1d each includes two longer sides and two shorter sides, and the third light-emitting element 1c and the fourth light-emitting element 1d face each other by the shorter sides thereof. In another embodiment, the third light-emitting element 1c and the fourth light-emitting element 1d face each other by the longer sides thereof (not shown). A connecting part 703 covers the shorter sides (or the longer sides in another embodiment) of the third light-emitting element 1c and the fourth light-emitting element 1d, electrically connects the second semiconductor layer 22 of the third light-emitting element 1c through the second upper insulating layer opening 602, electrically connects the first semiconductor layer 21 of the fourth light-emitting element 1d through the first upper insulating layer opening 601, and further connects the third light-emitting element 1c and the fourth light-emitting element 1d in series. The connecting part 703 covers all or a portion of the first upper insulating layer opening 601 and/or that of the first lower insulating layer opening 301 (not shown) disposed on the concave portion 200 of the fourth light-emitting element 1d, but the connecting part 703 covers all of the second upper insulating layer opening 602 on the third light-emitting element 1c. The same connecting part 703 covers the plurality of first upper insulating layer openings 601 on the longer side and the shorter side of the fourth light-emitting element 1d, so that the projected area of the connecting part 703 projected on the fourth light-emitting element 1d is larger than that of the connecting part 703 projected on the third light-emitting element 1c. As shown in FIG. 1, in the top view of the light-emitting device 1, the connecting part 703 surrounds a part of the second extension electrode 72. In the cross-sectional view of the light-emitting device 1, the connecting part 703 and the second extension electrode 72 conformally cover the side surfaces of the third light-emitting element 1c and the fourth light-emitting element 1d and the first surface 101 of the substrate 10.

As shown in FIGS. 1 and 2, the second extension electrode 72 covers all or a portion of the second upper insulating layer opening 602 on the sixth light-emitting element 1f and extends to cover the fourth light-emitting element 1d and the fifth light-emitting element 1e. As shown in FIGS. 1 and 3, the first extension electrode 71 covers all or a portion of the first upper insulating layer opening 601 on the first light-emitting elements 1a and extends to cover the second light-emitting element 1b and the third light-emitting element 1c.

The areas of the first extension electrode 71 and the plurality of connecting parts 701~705 covering the first semiconductor layer 21 uncovered in the concave portion 200 of the light-emitting elements 1a~1f are designed by considering the trade-off between the forward voltage (Vf) and the current spreading of the light-emitting device 1. Specifically, the larger the area of the first extension electrode 71 and the plurality of connecting parts 701~705 in contact with the first semiconductor layer 21 is, the lower the forward voltage of the light-emitting device 1 is. If the area of the first extension electrode 71 and the plurality of connecting parts 701~705 in contact with the first semiconductor layer 21 is too large, the light-emitting device 1 encounters a current blocking effect. In order to achieve acceptable forward voltage (Vf) and better current spreading, the area of the first extension electrode 71 and the plurality of connecting parts 701~705 in contact with the first semiconductor layer 21 needs to be stably controlled. The first extension electrode 71 and the plurality of connecting parts 701~705 contact the first semiconductor layer 21 through the first upper insulating layer opening 601. Since the first upper insulating layer opening 601 is prone to be overly etched, it is difficult to control the opening size of the first upper insulating layer opening 601. Therefore, the first extension electrode 71 and the plurality of connecting parts 701~705 partially cover the first upper insulating layer opening 601 adjacent to the isolation region ISO. The first extension electrode 71 and the plurality of connecting parts 701~705 partially covering the first upper insulating layer opening 601 includes first side most close to the isolation region ISO or the trench 1000t, and the first side is separated from the edge of the first semiconductor layer 21 most close to the isolation region ISO or the trench 1000t by a width larger than 5 μm to prevent the first extension electrode 71 and the plurality of connecting parts 701~705 from covering too much area of the first semiconductor layer 21. The plurality of connecting parts 701~705 can cover all area of the first upper insulating layer opening 601 which is away from the isolation region ISO based on other consideration and the product application.

In an embodiment, when the first extension electrode 71 and the plurality of connecting parts 701~705 cover a portion of the first upper insulating layer opening 601, the protective layer 80 formed in the subsequent process includes a Distributed Bragg Reflector (DBR) structure. The Distributed Bragg Reflector structure includes multiple stacks with different film thicknesses. Comparing with metal materials, the Distributed Bragg Reflector includes a higher reflectivity for light having a broader wavelength band and light emitting angle. The Distributed Bragg Reflector covers the first semiconductor layer 21 which is not covered by the first extension electrodes 71 and the plurality of connecting parts 701~705 to increase the light extraction efficiency of the light-emitting device 1.

In another embodiment, the protective layer 80 includes a light-transmitting insulating material, for example, $SiO_2$, $SiN_x$, $TiO_2$, $MgF_2$, or the like. Moreover, the protective layer 80 includes a thickness larger than that of the first extension electrode 71, the second extension electrode 72, or the plurality of connecting parts 701~705.

In order to electrically connect the adjacent light-emitting elements 1a~1f, the plurality of connecting parts 701~705 cover a portion of the adjacent light-emitting elements 1a~1f and the trench 1000t. In consideration of the current spreading efficiency and the symmetry of the light-emitting pattern, the amount and the arrangement of the plurality of connecting parts 701~705 can be changed in various ways.

The first connecting part 701 connects the first semiconductor layer 21 of the second light-emitting element 1b and the second semiconductor layer 22, the conductive contact layer 40, or the reflective structure 50 of the first light-emitting element 1a, thereby electrically connects to the second semiconductor layers 22 of the first light-emitting element 1a. The second connecting part 702 connects the first semiconductor layer 21 of the third light-emitting element 1c and the second semiconductor layer 22, the conductive contact layer 40, or the reflective structure 50 of the second light-emitting element 1b, thereby electrically connects to the second semiconductor layers 22 of the second light-emitting element 1b. The third connecting part 703 connects the first semiconductor layer 21 of the fourth light-emitting element 1d and the second semiconductor layer 22, the conductive contact layer 40, or the reflective structure 50 of the third light-emitting element 1c, thereby electrically connects to the second semiconductor layers 22 of the third light-emitting element 1c. The fourth connecting part 704 connects the first semiconductor layer 21 of the fifth light-emitting element 1e and the second semiconductor layer 22, the conductive contact layer 40, or the reflective structure 50 of the fourth light-emitting element 1d, thereby electrically connects to the second semiconductor layers 22 of the fourth light-emitting element 1d. The fifth connecting part 705 connects the first semiconductor layer 21 of the sixth light-emitting element 1f and the second semiconductor layer 22, the conductive contact layer 40, or the reflective structure 50 of the fifth light-emitting element 1e, thereby electrically connects to the second semiconductor layers 22 of the fifth light-emitting element 1e. The light-emitting elements 1a~1f are electrically connected in series through the plurality of connecting parts 701~705. Specifically, the plurality of connecting parts 701~705 is electrically connected to the first semiconductor layers 21 of the light-emitting elements 1a~1f uncovered in the first upper insulating layer opening 601 and is electrically connected to the second semiconductor layers 22 of the light-emitting elements 1a~1f through the second upper insulating layer opening 602. In some embodiments, the plurality of connecting part 701~705 can directly contact any one or multiple layers of the second semiconductor layer 22, the conductive contact layer 40, and the reflective structure 50, and then is electrically connected to the second semiconductor layers 22 of the light-emitting elements 1a~1f.

Each of the plurality of connecting parts 701~705 is more distant from the isolation region ISO than the edges of the light-emitting elements 1a~1f to the isolation region ISO. In the embodiment, in order to protect the interior structures of the light-emitting elements 1a~1f from the moisture infiltrating from the outside, the plurality of connecting parts 701~705 is disposed farther away from the edge of the substrate 10 comparing with the edges of the light-emitting elements 1a~1f.

The isolation region ISO and the trench 1000t are the areas where the substrate 10 is uncovered by the semiconductor stack 20, and the depth of the isolation region ISO below the top surface of the semiconductor stack 20 is larger than 3 so that the topography thereof changes obviously. Therefore, the surface topography of the lower insulating layer 30, the upper insulating layer 60, or the plurality of connecting parts 701~705 covering the isolation region ISO and the trench 1000t changes significantly, such as height changes. In order to connect two adjacent light-emitting elements of the light-emitting elements 1a~1f, the plurality of connecting parts 701~705 is formed on the trench 1000t whose topography has significant changes that may cause the plurality of connecting parts 701~705 reliability problems, particularly the damage imposed by the external environment. Therefore, the reliability of the light-emitting device 1 can be improved by reducing the areas of the plurality of connecting parts 701~705 located above the trench 1000t. For example, the plurality of connecting parts 701~705 each includes a first length parallel to the longer side of the light-emitting elements 1a~1f, the longer side includes a second length, and the first length is 20%~50%, 20%~60%, or 20%~70% of the second length. That is, each connecting part 701~705 is located on a part of the light-emitting elements adjacent to the trench 1000t and extends across a portion of the trench 1000t, such as two opposite sides of two adjacent light-emitting elements of the light-emitting elements 1a~1f and the trench 1000t, so as to reduce the area size of the plurality of connecting part 701~705 spanning across the trench 1000t so the failure probability of the plurality of connecting parts 701~705 is reduced and the reliability of the light-emitting device 1 is improved.

The first extension electrode 71, the second extension electrode 72, and the plurality of connecting parts 701~705 including the same material can be formed in the same process after forming the upper insulating layer 60, and thus the first extension electrode 71 and the second extension electrode 72 each includes a portion located on the same horizontal position relative to the first surface 101 of the substrate 10, but the application is not limited to this.

The first extension electrode 71, the second extension electrode 72, and the plurality of connecting parts 701~705 include a reflective layer including aluminum (Al) or silver (Ag), and the reflective layer can be formed on an adhesive layer including titanium (Ti), chromium (Cr), or nickel (Ni). In addition, a protective layer including a single-layer or multiple sublayers and including nickel (Ni), chromium (Cr) or gold (Au) can be formed on the reflective layer. The first extension electrode 71, the second extension electrode 72, and the plurality of connecting parts 701~705 include the multilayer structure, for example, Cr/Al/Ni/Ti/Ni/Ti/Au/Ti layers or Cr/Al/Ti/Pt/Ti/Pt/Au/Pt layers. In some embodiments, the multilayer structure of the first extension electrode 71, the second extension electrode 72, and the plurality of connecting parts 701~705 can omit the adhesive layer.

The protective layer 80 covers the first extension electrode 71, the second extension electrode 72, and the plurality of connecting parts 701~705. In addition, the protective layer 80 can cover all of the upper insulating layer 60 and/or the lower insulating layer 30 along the peripheries of the light-emitting elements 1a~1f, or can cover a part of the upper insulating layer 60 and/or the lower insulating layer 30 to uncover the edge portions of the upper insulating layer 60 and/or the lower insulating layer 30 along the peripheries of the light-emitting elements 1a~1f. In an embodiment, the protective layer 80 covers a portion of the substrate 10 along the peripheries of the substrate 10 to uncover the first surface 101 of the substrate 10 (not shown) or the upper insulating layer 60 and/or the lower insulating layer 30 adjacent to the peripheries of the substrate 10 as shown in FIG. 2 and FIG. 3. Therefore, the protective layer 80 includes an edge located between the edges of the light-emitting elements 1a~1f and the edge of the substrate 10. The distance between the edge of the protective layer 80 and the edge of the substrate 10 can be approximately 2 μm~12 μm or 4 μm~10 μm. In addition, in order to prevent the moisture from penetrating thereinto and damaging the plurality of connecting parts 701~705, the shortest distance between the edge of the protective layer 80 and the edge of the plurality of connecting parts 701~705 should be as large as possible, and the shortest distance can be between 15 µm and 50 µm. When the shortest distance is less than 15 µm, when the light-emitting device 1 is operated at a low current, for example, 25 mA, the plurality of connecting parts 701~705 is easily damaged by the moisture.

The protective layer 80 includes a first protective layer opening 801 to uncover the first extension electrode 71 and a second protective layer opening 802 to uncover the second extension electrode 72. The first protective layer opening 801 and the second protective layer opening 802 are respectively disposed on the first light-emitting element 1a and the sixth light-emitting element 1f. Except for the first protective layer opening 801 and the second protective layer opening 802, other regions of the light-emitting elements 1a~1f are covered by the protective layer 80. Therefore, the upper surfaces and the side surfaces of the plurality of connecting parts 701~705 are covered by the protective layer 80.

In an embodiment, as shown in FIG. 1, the first protective layer opening 801 of the protective layer 80 is spaced apart from the first upper insulating layer openings 601 of the upper insulating layer 60 without overlapping with each other, and the second protective layer opening 802 is spaced apart from the second upper insulating layer openings 602 of the upper insulating layer 60 without overlapping with each other. Therefore, even if the solder paste penetrates the first protective layer opening 801 and/or the second protective layer opening 802 of the protective layer 80, the solder paste can be insulated by the upper insulating layer 60 and prevented from diffusing through the first upper insulating layer opening 601 and/or the second upper insulating layer openings 602 of the upper insulating layer 60, so the solder paste does not contaminate the reflective structure. However, the present application is not limited to this. The first protective layer opening 801 and the second protective layer opening 802 of the protective layer 80 can be arranged to respectively overlap the first upper insulating layer opening 601 and the second upper insulating layer opening 602 of the upper insulating layer 60 in the case that the light-emitting device 1 is eutectic bonded to the package substrate 51 illustrated in FIG. 8.

When the plurality of light-emitting elements is connected in series, a high voltage chip, which can be operated under the condition of high voltage and low current, is formed. When the plurality of light-emitting elements is connected in series, the n-type electrode pad and the p-type electrode pad are respectively provided to continuously cover two or more light-emitting elements and the trench. The trench separating the plurality of light-emitting elements makes the surfaces of the n-type electrode pad and the p-type electrode pad undulated. When the n-type electrode pad and the p-type electrode pad are mounted onto the submount or the printed circuit board with solder paste, the stress from the package is transmitted to the interior structure of the high-voltage chip through the electrode pads, so that the interior structure of the chip is damaged and the moisture from the outside penetrates thereinto easily. Although multiple n-type electrode pads and multiple p-type electrode pads can be applied to form a one-to-one configuration of the electrode pads and the light-emitting elements, each of the separately arranged electrode pad has a relatively small area, which does not benefit the following package mounting process. When the separately arranged electrode pads are soldered with solder paste, after the solder paste printing, mounting, solder reflow, and other processes, it is not easy for the solder paste to sustain an intact appearance on the multiple n-type electrode pads or the multiple p-type electrode pads. The solder paste may agglomerate regionally and result in the uneven distribution of the whole solder paste. Therefore, in an embodiment of the present application, a bulk n-type electrode pad (such as the first electrode pad 91) and a bulk p-type electrode pad (such as the second electrode pad 92) are provided to cover the first group containing light-emitting elements 1a~1c and the second group containing light-emitting elements 1d~1f respectively. By arranging a patterned sacrificial layer 90 or a cavity under the first electrode pad 91 and the second electrode pad 92, the first electrode pad 91 and the second electrode pad 92 are suspended or partially suspended on the trench 1000t between two adjacent light-emitting elements of the light-emitting elements 1a~1f which are connected in series. The n-type electrode pad is floated on the trench 1000t and formed on the first group containing light-emitting elements 1a~1c, and the p-type electrode pad is floated on the trench 1000t and formed on the second group containing light-emitting elements 1d~1f. The n-type electrode pad and the p-type electrode pad are electrically connected to the first light-emitting element 1a and the sixth light-emitting element 1f respectively. The n-type electrode pad and the p-type electrode pad each includes a larger and flatter surface, which not only facilitates packaging but also improves the heat dissipation. In an embodiment of the present application, as shown in FIGS. 2~3, the cavity (not shown) under the first electrode pad 91 and the second electrode pad 92 includes a height between 1 µm and 5 µm, or the patterned sacrificial layer 90 under the first electrode pad 91 and the second electrode pad 92 includes a thickness between 1 µm and 5 µm.

Figure 6:
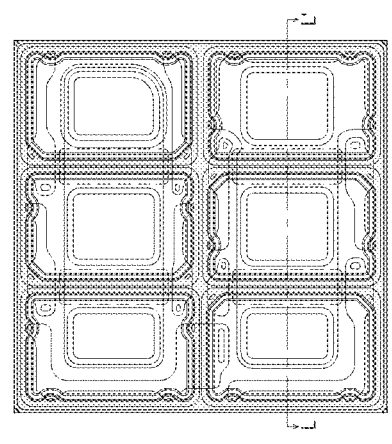
FIG. 6 illustrates a cross-sectional view disclosing a method for forming a patterned sacrificial layer in accordance with an embodiment of the present application.
Figure 6:
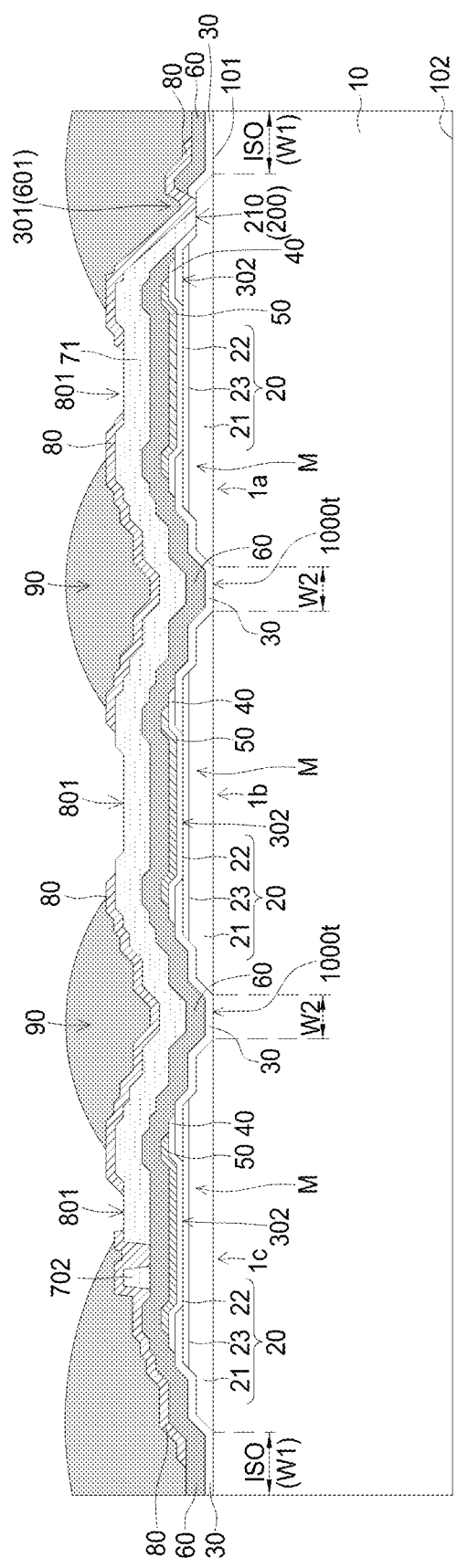
Figure 7:
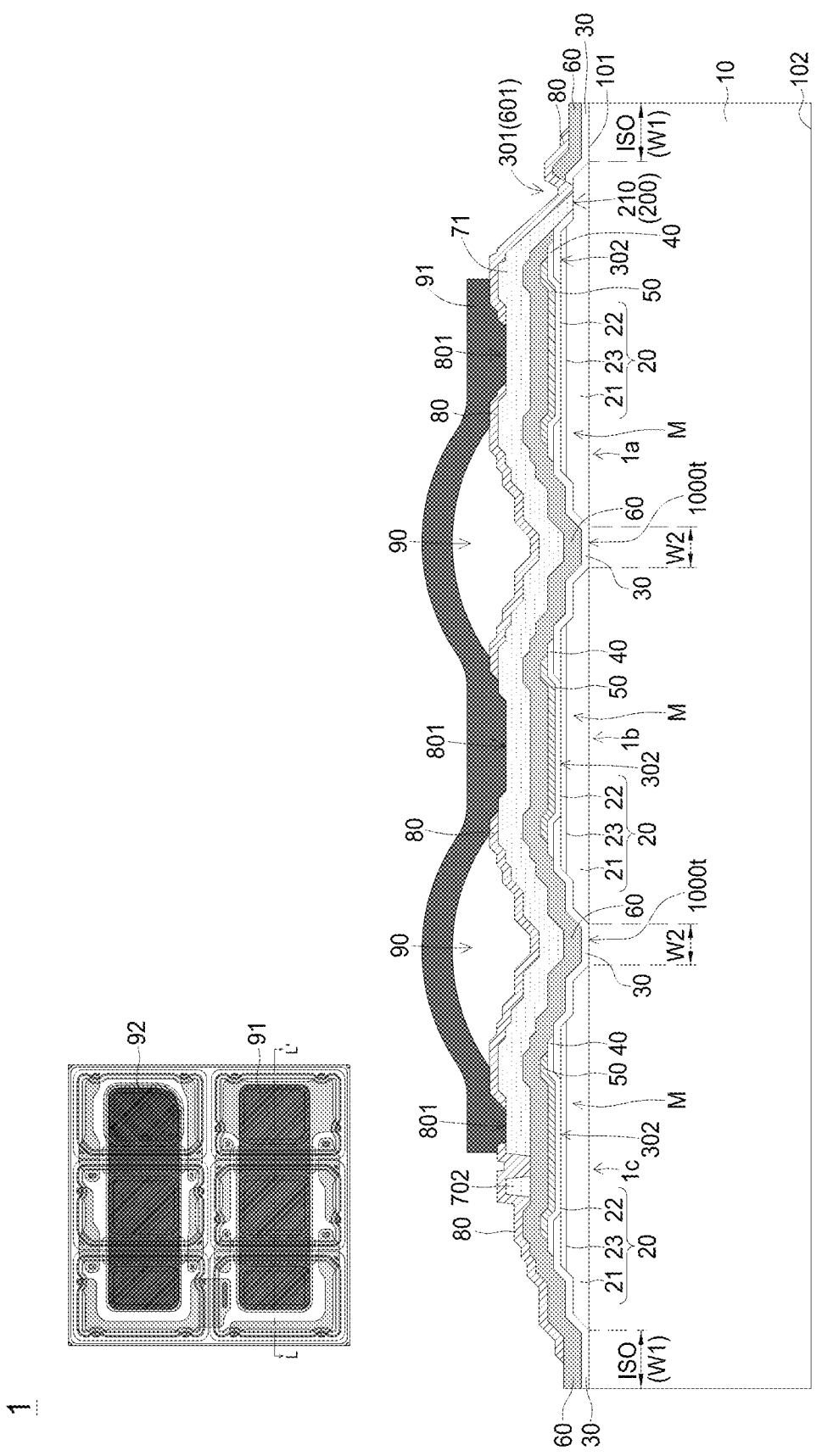
FIG. 7 illustrates a cross-sectional view disclosing a method for forming a patterned sacrificial layer in accordance with an embodiment of the present application.

FIGS. 6-7 illustrate cross-sectional views disclosing a method for forming the patterned sacrificial layer 90 in accordance with an embodiment of the present application. As shown in FIG. 6, the patterned sacrificial layer 90 is formed on the isolation region ISO and the trench 1000t by the steps of spin coating, exposure, and development after forming the protective layer 80. After the patterned sacrificial layer 90 is filled into the trench 1000t, a flat surface for forming the subsequently disposed first electrode pad 91 and the second electrode pad 92 is provided. After forming the patterned sacrificial layer 90, a mask layer (not shown) is formed thereon by spin coating, exposure, development, etc., then the first electrode pad 91 and the second electrode pad 92 are formed on the mask layer by chemical vapor deposition or physical vapor deposition, and the mask layer is removed finally. As shown in FIG. 7, after the first electrode pad 91 and the second electrode pad 92 are formed, the patterned sacrificial layer 90 can be entirely removed or partially removed to form a cavity under the first electrode pad 91 and the second electrode pad 92, or the patterned sacrificial layer 90 can be retained in the cavity. In an embodiment, when the patterned sacrificial layer 90 is partially removed, the patterned sacrificial layer 90 and the cavity can both be formed under the first electrode pad 91 and the second electrode pad 92. In a cross-sectional view of the light-emitting device 1, an upper surface and/or a lower surface of the first electrode pad 91 or the second electrode pad 92 includes a curved surface as shown in FIG. 7 or a flat surface as shown in FIGS. 2~3.

The mask layer (not shown) and the patterned sacrificial layer 90 include materials that can be easily removed, and the removing process of the mask layer and the patterned sacrificial layer 90 affects the aforementioned layers or structures like semiconductor stacks, metal layers, and protective layers little. The material of the patterned sacrificial layer 90 includes an insulating material to provide the electrical isolation, including organic materials, such as photoresist, or inorganic materials, such as silicon dioxide, silicon nitride, or silicon carbonitride. In the embodiment, the material of the pattern sacrificial layer 90 includes photoresist, which makes the pattern sacrificial layer 90 having the function of stress buffering. The removal method thereof can be determined depending on the materials of the mask layer and the pattern sacrificial layer 90. For example, when the material of the mask layer or the pattern sacrificial layer 90 includes polyimide or photoresist, plasma etching can remove that. When the material of the mask layer or the pattern sacrificial layer 90 includes silicon oxide, hydrofluoric acid solvent can remove silicon oxide by the reaction between hydrofluoric acid solvent and silicon oxide.

Figure 8:
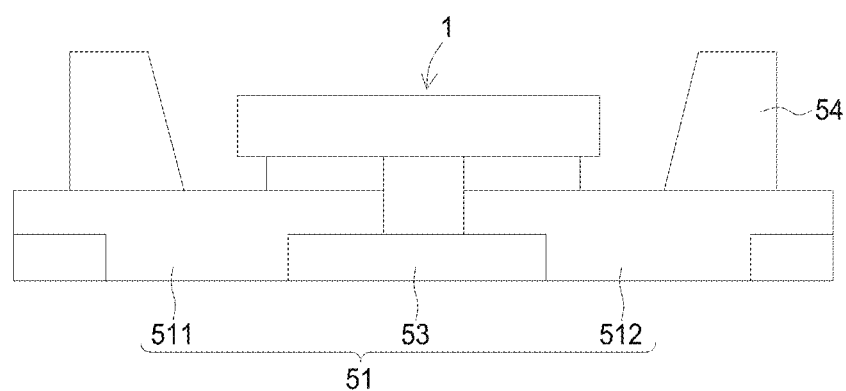
FIG. 8 illustrates a schematic diagram of a light-emitting apparatus 2 in accordance with an embodiment of the present application.

In an embodiment, as shown in FIG. 8, the first electrode pads 91 and the second electrode pads 92 can be bonded to the electrodes (such as the first spacer 511 and the second spacer 512) on the package substrate 51 by solder paste, high temperature, and/or ultrasonic waves.

In another embodiment, as shown in FIG. 2 and FIG. 3, in order to increase the stability of the first electrode pad 91 and the second electrode pad 92, a first bonding pad 911 and a second bonding pad 922 are respectively formed on the first electrode pad 91 and the second electrode pad 92 by evaporation, electroplating, or screen printing. The first bonding pad 911 and the second bonding pad 922 each includes a thickness respectively larger than that of the first electrode pad 91 and the second electrode pad 92. The first bonding pad 911 and the second bonding pad 922 each includes a thickness of several tens of microns or more, for example, 20 µm~100 µm. The first bonding pad 911 and the second bonding pad 922 can be bonded to the electrodes (such as the first spacer 511 and the second spacer 512) on the package substrate 51 by solder paste, high temperature, and/or ultrasonic waves, as shown in FIG. 8.

The first electrode pad 91 contacts the first extension electrode 71 uncovered in one or more first protective layer openings 801 of the protective layer 80, and the second electrode pad 92 contacts the second extension electrode 72 through one or more first protective layer openings 801 of the protective layer 80. As shown in FIG. 1, the first electrode pad 91 covers all of the first protective layer opening 801 of the protective layer 80, and the second electrode pad 92 covers all of the second protective layer opening 802 of the protective layer 80. Furthermore, as shown in FIG. 1, the first electrode pad 91 and the second electrode pad 92 are formed on the plurality of light-emitting elements 1a~1f. As shown in FIG. 1, the first electrode pad 91 covers the upper regions of the first group containing light-emitting elements 1a~1c and the second electrode pad 92 covers the upper regions of the second group containing light-emitting elements 1d~1f. Therefore, the areas of the first electrode pad 91 and the second electrode pad 92 can be formed large, which facilitate the packaging process of the light-emitting device 1. Furthermore, the heat generated in each of the light-emitting elements 1a~1f can be radiated to the outside by the first electrode pad 91 and the second electrode pad 92.

The first electrode pad 91 and the second electrode pad 92, or the first bonding pad 911 and the second bonding pad 922 are parts for soldering the light-emitting device 1 to a package substrate, a printed circuit board, or the like, and are formed of materials suitable for soldering. For example, the first electrode pad 91, the second electrode pad 92, the first bonding pad 911, and the second bonding pad 922 each includes an Au layer or an AuSn layer.

The first electrode pad 91 and the second electrode pad 92 include different polarity, for example, the first electrode pad 91 can be an n-type electrode pad, and the second electrode pad 92 can be a p-type electrode pad. The first electrode pad 91 is located on the first group containing light-emitting elements 1a~1c, formed along the peripheries of the first extension electrode 71, and includes substantially the same shape as that of the first extension electrode 71. The second electrode pad 92 is located on the second group containing light-emitting elements 1d~1f, formed along the peripheries of the second extension electrodes 72, and includes substantially the same shape as that of the second extension electrodes 72.

The first extension electrode 71, the plurality of connecting parts 701~705, the second extension electrode 72, the first electrode pad 91, and the second electrode pad 92 include metal materials, such as chromium (Cr), titanium (Ti), tungsten (W), gold (Au), aluminum (Al), indium (In), tin (Sn), nickel (Ni), platinum (Pt), silver (Ag), or an alloy of the above materials. The first extension electrode 71, the plurality of connecting parts 701~705, the second extension electrode 72, the first electrode pad 91, and the second electrode pad 92 each includes a single layer or multiple layers. For example, the first extension electrode 71, the plurality of connecting parts 701~705, the second extension electrode 72, the first electrode pad 91, or the second electrode pad 92 includes Ti/Au layers, Ti/Pt/Au layers, Cr/Au layers, Cr/Pt/Au layers, Ni/Au layers, Ni/Pt/Au layers, Cr/Al/Ni/Ti/Ni/Ti/Au/Ti layers, Cr/Al/Cr/Ni/Au layers, or Ag/NiTi/TiW/Pt layers. The first electrode pad 91 and the second electrode pad 92 can form a current path for the external power to supply electricity to the light-emitting elements 1a~1f. The first extension electrode 71, the plurality of connecting parts 701~705, the second extension electrode 72, the first electrode pad 91, or the second electrode pad 92 includes a thickness between 1 µm and 100 µm, 1.2 µm and 60 or 1.5 µm and 6 µm.

The first extension electrode 71, the plurality of connecting parts 701~705, and the second extension electrode 72 can be formed in the same process and have the same metal stack. The first electrode pad 91 and the second electrode pad 92 can be formed in the same process and have the same metal stack. In the embodiment, the metal stacks provided in different processes have different thicknesses and stack structures.

The lower insulating layer 30, the upper insulating layer 60, or the protective layer 80 includes a material including a refractive index lower than that of the second semiconductor layer 22. The lower insulating layer 30, the upper insulating layer 60, or the protective layer 80 includes a single-layer structure including silicon oxide ($SiO_x$), silicon nitride ($SiN_x$), or silicon oxynitride ($SiO_xN_y$). The lower insulating layer 30, the upper insulating layer 60, or the protective layer 80 incudes a Distributed Bragg Reflector (DBR) structure formed by alternately stacking high-refractive index layers and low-refractive index layers to selectively reflect the light of a specific wavelength. For example, an insulating reflective structure with high reflectivity can be formed by stacking $SiO_2/TiO_2$ layers, $SiO_2/Nb_2O_5$ layers, or $MgF_2/Nb_2O_5$ layers. When $SiO_2/TiO_2$ layers, $SiO_2/Nb_2O_5$ layers, or $MgF_2/Nb_2O_5$ layers are provided to form the Distributed Bragg Reflector (DBR) structure, each layer of the Distributed Bragg Reflector (DBR) structure includes an optical thickness which is one or an integral multiple of a quarter of the wavelength of the light emitted by the active layer, and the Distributed Bragg Reflector (DBR) includes 4 pairs to 20 pairs of $SiO_2/TiO_2$ layers, $SiO_2/Nb_2O_5$ layers, or MgF$_2$/Nb$_2$O$_5$ layers. The optical thickness of each layer of the Distributed Bragg Reflector (DBR) structure has a ±30% deviation on the base of one or an integer multiple of λ/4. Since the optical thickness of each layer of the Distributed Bragg Reflector (DBR) structure affects the reflectivity, e-beam evaporation is provided to form the Distributed Bragg Reflector (DBR) to stably control the thickness of each layer of the Distributed Bragg Reflector (DBR) structure. The lower insulating layer 30, the upper insulating layer 60, or the protective layer 80 includes a thickness between 0.5 μm~4 μm, between 2.5 μm~3.5 μm, or between 2.7 μm~3.3 μm. The optical thickness difference between two adjacent high refractive index layer and low refractive index layer is less than 0.05λ or 0.025λ. The optical thickness is the product of the physical thickness and the refractive index (n) of the layer thereof. The uppermost layer of the protective layer 80 can be the SiN$_x$ layer. Since SiN$_x$ is excellent in moisture resistance, the light-emitting device 1 can be protected from moisture. In an embodiment, the uppermost layer of the protective layer 80 can be formed by atomic layer deposition (ALD), and the material can be selected from oxides, such as aluminum oxide (Al$_2$O$_3$), titanium oxide (TiO$_2$), or nitrides, such as aluminum nitride (AlN), silicon nitride (SiN$_x$), or titanium nitride (TiN).

FIG. 8 illustrates a schematic diagram of a light-emitting apparatus 2 in accordance with an embodiment of the present application. The light-emitting device 1 in the foregoing embodiment is mounted on the first spacer 511 and the second spacer 512 of the package substrate 51 in the form of flip-chip. The first spacer 511 and the second spacer 512 are electrically insulated from each other by an insulating portion 53 including an insulating material. The main light-extraction surface of the flip chip is the second surface 102 of the substrate 10 illustrated in FIGS. 2~3. In order to increase the light extraction efficiency of the light-emitting apparatus 2, a reflection unit 54 can be arranged around the light-emitting device 1. The light-emitting device 1 is electrically connected to the first spacer 511 and the second spacer 512 of the package substrate 51 through the first electrode pad 91 and the second electrode pad 92, or the first pad 911 and the second pad 922, respectively, as illustrated in FIGS. 1~3.

Figure 9:
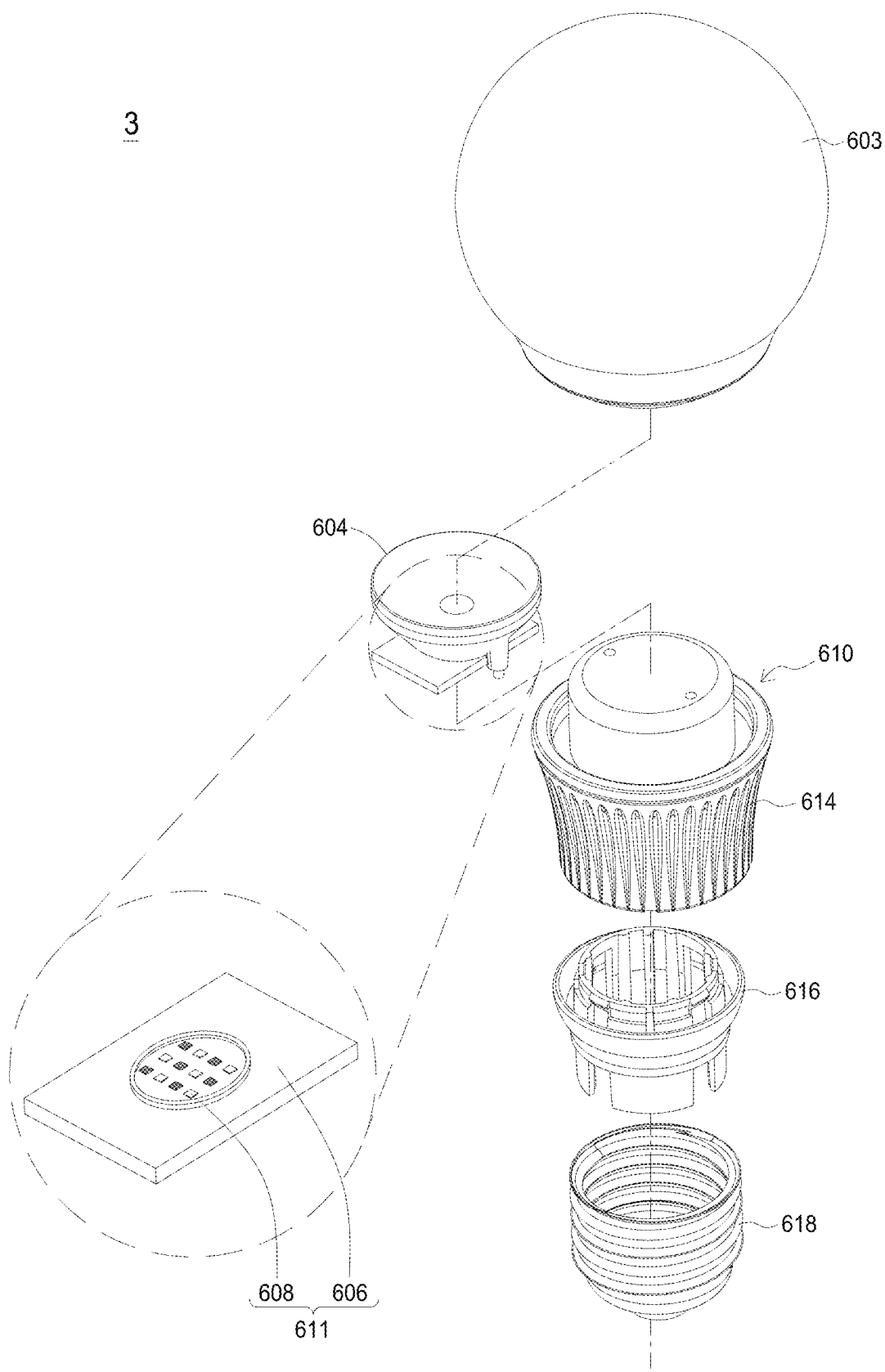
FIG. 9 illustrates a schematic diagram of a light-emitting apparatus 3 in accordance with an embodiment of the present application.

FIG. 9 illustrates a schematic diagram of a light-emitting apparatus 3 in accordance with an embodiment of the present application. The light-emitting apparatus 3 includes a bulb, including an envelope 603, a reflector 604, a light-emitting module 611, a base 610, a heat sink 614, a connecting part 616, and an electrical connecting element 618. The light-emitting module 611 includes a submount 606, and a plurality of light-emitting devices 608 located on the submount 606, wherein the plurality of light-emitting devices 608 can be the light-emitting device 1 or the light-emitting apparatus 2 described in the above embodiments.

Figure 10:
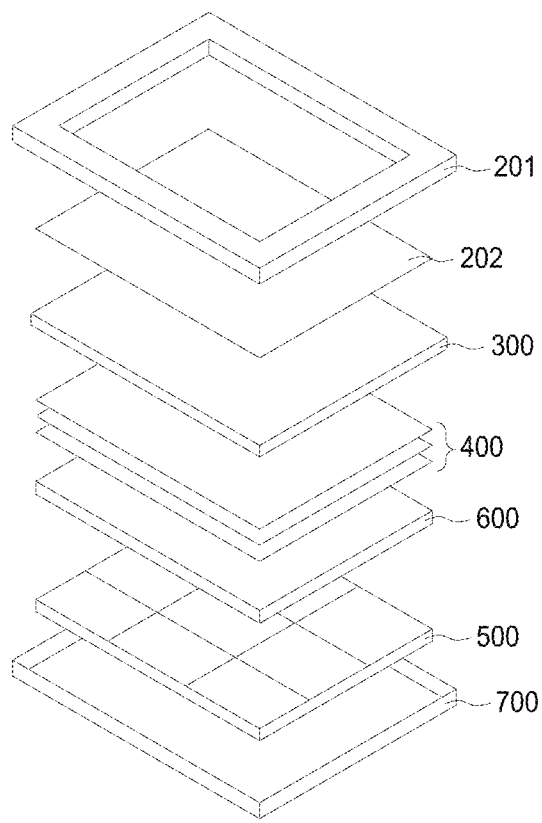
FIG. 10 illustrates a schematic diagram of a light-emitting apparatus 4 in accordance with an embodiment of the present application.

FIG. 10 illustrates a schematic diagram of a backlight module 4 in accordance with an embodiment of the present application. The backlight module 4 includes a first frame 201, a liquid crystal display 202, a brightness enhancement film 300, an optical module 400, a light-emitting module assembly 500, and a second frame 700, wherein the light-emitting module assembly 500 includes any one of the above light-emitting device 1 and light-emitting apparatus 2 disposed in the light-emitting module assembly 500 in edge type or direct type. In another embodiment of the present application, the backlight module 4 further includes a wavelength conversion structure 600 on the light-emitting module assembly 500.

Figure 11:
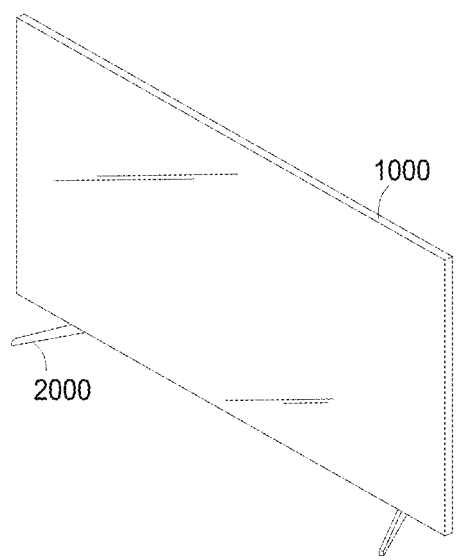
FIG. 11 illustrates a schematic diagram of a light-emitting apparatus 5 in accordance with an embodiment of the present application.

FIG. 11 illustrates a schematic diagram of a display 5 in accordance with an embodiment of the present application. The display 5 includes a LED panel 1000; a current source (not shown); a bracket 2000 to support the LED panel 1000, wherein the LED panel 1000 includes a plurality of the light-emitting devices 1, a plurality of light-emitting apparatuses 2, or the backlight module 4. The LED panel 1000 includes a plurality of pixel units, and each pixel unit includes a plurality of light-emitting devices 1 or light-emitting apparatuses 2 respectively emitting different colors. For example, each pixel unit includes three light-emitting devices 1 that respectively emits the red light, the green light, and the blue light respectively.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
 a plurality of light-emitting elements, comprising a first group light-emitting elements and a second group light-emitting elements;
 a trench separating the plurality of light-emitting elements;
 a protective layer covering the plurality of light-emitting elements;
 a first electrode pad covering the first group light-emitting elements and located on the trench;
 a second electrode pad covering the second group light-emitting elements and located on the trench; and
 a cavity located on the trench, formed between the first electrode pad and the protective layer or formed between the second electrode pad and the protective layer.

2. The light-emitting device according to claim 1, wherein in a cross-sectional view of the light-emitting device, the first electrode pad or the second electrode pad includes a lower surface including a curved surface.

3. The light-emitting device according to claim 1, further including a patterned sacrificial layer formed in the cavity.

4. The light-emitting device according to claim 3, wherein the patterned sacrificial layer includes organic material or inorganic material.

5. The light-emitting device according to claim 3, wherein the cavity includes a height between 1 μm and 5 μm.

6. The light-emitting device according to claim 3, wherein the patterned sacrificial layer includes a thickness between 1 μm and 5 μm.

7. The light-emitting device according to claim 1, further including a first bonding pad and a second bonding pad respectively formed on the first electrode pad and the second electrode pad.

8. The light-emitting device according to claim 7, wherein the first bonding pad and the second bonding pad include solder paste.

9. The light-emitting device according to claim 7 wherein the first bonding pad and the second bonding pad each includes a thickness respectively larger than that of the first electrode pad and that of the second electrode pad.

10. The light-emitting device according to claim 1, wherein the protective layer includes one or more first protective layer openings formed between the first electrode pad and the first group light-emitting elements, and one or more second protective layer openings formed between the second electrode pad and the second group light-emitting elements.

11. The light-emitting device according to claim 1, wherein the light-emitting device includes a side having a length between 800 μm and 2000 μm.

12. The light-emitting device according to claim 1, further including a substrate, wherein the substrate includes an isolation region including a first width uncovered around the plurality of light-emitting elements.

13. The light-emitting device according to claim 12, wherein the trench includes a second width smaller than the first width.

14. The light-emitting device according to claim 1, wherein the plurality of light-emitting elements each includes a semiconductor stack including a first semiconductor layer, a second semiconductor layer, and an active layer between the first semiconductor layer and the second semiconductor layer.

15. The light-emitting device according to claim 14, wherein the plurality of light-emitting elements each includes a plurality of concave portions extending toward an interior of each of the plurality of light-emitting elements, and the first semiconductor layer is uncovered in the plurality of concave portions.

16. The light-emitting device according to claim 15, wherein an amount of concave portions arranged on a longer side of the plurality of light-emitting elements is larger than that arranged on a shorter side of the plurality of light-emitting elements.

17. The light-emitting device according to claim 15, further including a first extension electrode including a plurality of first extension electrode convex portions respectively corresponding to the plurality of concave portions of the plurality of the light-emitting elements.

18. The light-emitting device according to claim 17, further including an upper insulating layer covering the plurality of light-emitting elements, wherein the upper insulating layer includes a plurality of first upper insulating layer openings respectively formed on the plurality of concave portions to uncover the first semiconductor layer of each of the plurality of light-emitting elements.

19. The light-emitting device according to claim 18, wherein the plurality of first extension electrode convex portions covers a portion of the plurality of first upper insulating layer openings.

20. The light-emitting device according to claim 17, wherein the first extension electrode partially overlaps with the first electrode pad.

* * * * *